Figure 1:
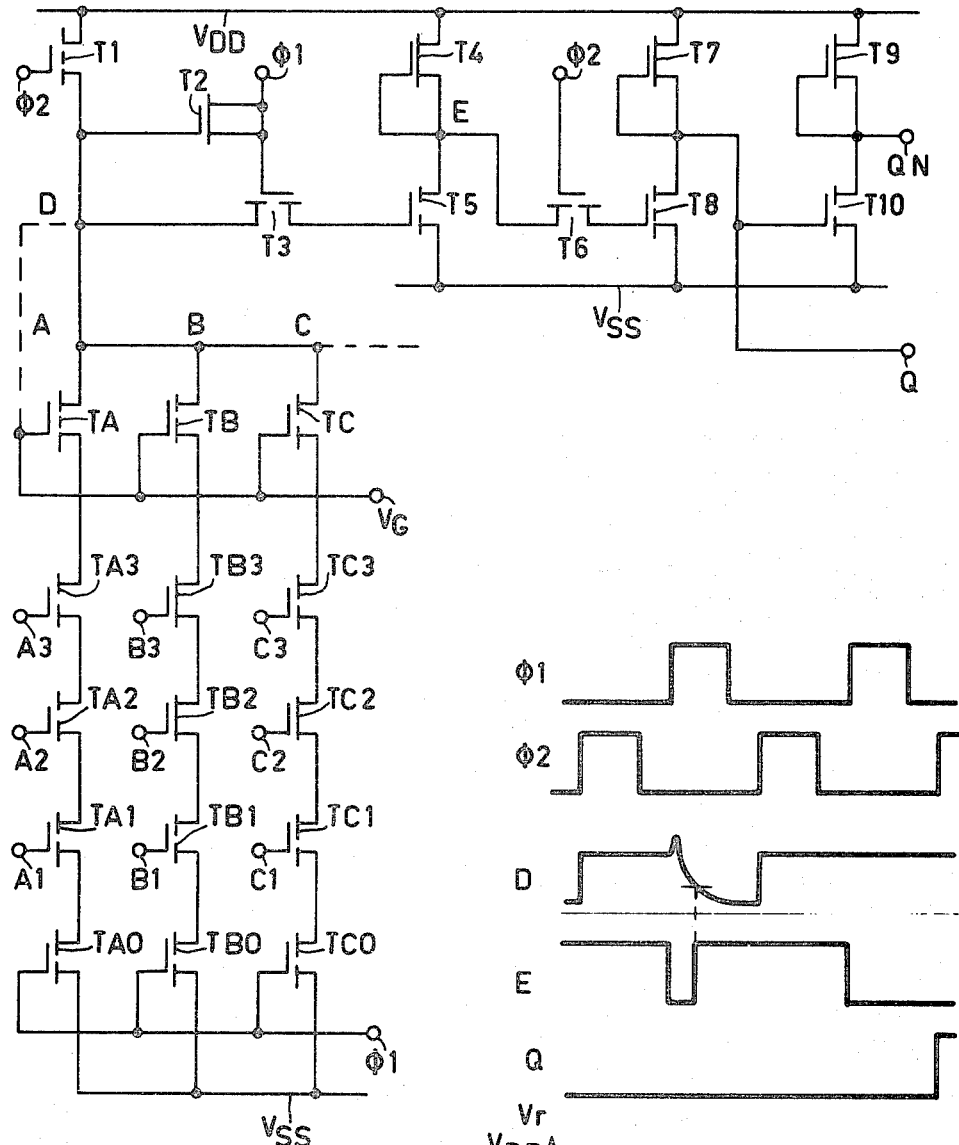

United States Patent [19]

Mathes

[11] Patent Number: 4,468,575
[45] Date of Patent: Aug. 28, 1984

[54] LOGIC CIRCUIT IN 2-PHASE MOS-TECHNOLOGY

[75] Inventor: Egon Mathes, Elmshorn, Fed. Rep. of Germany

[73] Assignee: U.S. Phillips Corporation, New York, N.Y.

[21] Appl. No.: 328,876

[22] Filed: Dec. 9, 1981

[30] Foreign Application Priority Data

Dec. 15, 1980 [DE] Fed. Rep. of Germany ....... 3047222

[51] Int. Cl.³ ................. H03K 19/017; H03K 19/096
[52] U.S. Cl. .................................... 307/481; 307/453
[58] Field of Search ............... 307/445, 448, 449, 450, 307/453, 452, 481, 482, 574, 582

[56] References Cited

U.S. PATENT DOCUMENTS

| | | | |
|---|---|---|---|
| 3,526,783 | 1/1970 | Booher | 307/481 |
| 3,573,487 | 4/1971 | Polkinghorn | 307/481 |
| 3,601,627 | 8/1971 | Booher | 307/453 |
| 3,982,138 | 9/1976 | Luisi et al. | 307/481 |
| 4,040,015 | 8/1977 | Fukuda | 307/452 |
| 4,107,548 | 8/1978 | Sakaba et al. | 307/453 |

Primary Examiner—John S. Heyman
Assistant Examiner—Timothy P. Callahan
Attorney, Agent, or Firm—Paul R. Miller

[57] ABSTRACT

In a logic circuit arrangement comprising a plurality of sticks formed by series arrangements of transistors which receive the signals to be processed a conductive stick not only has to discharge the output capacitance of the logic output but also other sticks which are not completely conductive, namely up to the first cut-off transistor. This may result in a very high capacitive load, which substantially reduces the maximum attainable switching speed. In accordance with the invention an additional transistor is arranged between each stick and the output of the entire logic circuit, which transistor receives a gate voltage such that current flow from the cut-off charged sticks via a conductive stick is prevented or delayed until the output signal of the logic circuit has assumed a value which unambiguously switches over the next output transistor. As a result of this, a conductive stick only has to discharge the output capacitance of the logic circuit arrangement, so that a substantially higher switching speed can be obtained.

7 Claims, 2 Drawing Figures

LOGIC CIRCUIT IN 2-PHASE MOS-TECHNOLOGY

The invention relates to a logic circuit in 2-phase MOS-technology, which circuit comprises a plurality of identical logic elements, which each comprise a series arrangement of MOS-transistors which receive the input signals to be processed, and a MOS sensing transistor which receives a sense clock signal, one end of each series arrangement being connected to a reference potential and the other end of each series arrangement being connected to an operating voltage via a common MOS charging transistor which receives the charge clock signal, the sensing transistors and the charging transistor never being conductive at the same time, and the main electrode of the charging transistor which is not coupled to the operating voltage and which is connected to the series arrangements constituting the output of the logic circuit to which output the gate of at least one MOS output transistor is connected, which supplies an unambiguous low signal when the output of the logic circuit carries a voltage between the operating voltage and a fraction thereof.

Such logic circuits are known, for example, from DE-AS No. 17 87 011 corresponding to U.S. Pat. No. 3,526,783. Such logic circuits are controlled by alternately applying a charge clock pulse $\phi 2$ and subsequently a sense clock pulse $\phi 1$. During the change clock signal $\phi 2$ the charging transistor which is then conductive charges the output of the logic circuit at least substantially to the operating voltage. Simultaneously the inputs of the transistors in the individual series arrangements receive the input signals to be processed. During the next sense clock signal $\phi 1$ the charging transistor is cut off and the sensing transistors are turned on, which transistors connect each series arrangement to the reference potential. If now a series arrangement is available in which all transistors without exception are conductive (AND condition satisfied), the output of the logic circuit is discharged to the reference potential via the series arrangement.

If a large number of series arrangements are interconnected, all the upper points of the series arrangements are also discharged. If the series arrangements further comprise a large number of MOS transistors in order to process a large number of input signals and in many of the series arrangements many of the consecutive transistors which are connected to the upper point of the series arrangement are turned on and only the transistor(s) coupled to the reference potential is (are) turned off, each series arrangement represents a substantial capacitive load, so that discharging via a fully conductive series arrangement takes a comparatively long time. As a result of this, the switching speed of the entire logic circuit is reduced.

It is an object of the invention to provide a logic circuit of the type mentioned in the opening paragraph by means of which a high switching speed and thus a high clock frequency can also be obtained in the case of an unfavourable combination of the input signals to be processed.

According to the invention this problem is solved in that in the connection of each series arrangement to the MOS charging transistor, an additional MOS-transistor is arranged and the gates of all the additional transistors, together receive such a signal that at least during the conductive phase of the sensing transistors, each additional MOS transistor between the MOS charging transistor and a series arrangement with at least one cut-off transistor is cut off at least for voltages between the operating voltage and a value lower than a fraction thereof on the logic-circuit output. Thus the additional transistors function as diodes, which only allow a current flow when the charging transistor conducts in order to charge the series arrangement, but which are cut off until a conductive series arrangement has discharged the output so far that the output transistor is turned off. During this discharging period a conducted series arrangement only needs to discharge the capacitance at the output of the logic circuit and not the other charged series arrangements.

Suitably, the additional transistors are enhancement-type MOS transistors, because these provide the simplest drive in the present case. For example, in one embodiment the signal on the gates of the additional transistors may be a direct voltage having a value smaller than the sum of the lowest voltage at which the output MOS transistor connected to the output of the logic circuit still supplies an unambiguous low signal, and the threshold voltage of the additional transistors. As a result of this, the additional transistors of the non-conductive series arrangements are not turned on until the voltage on the output of the logic circuit has decreased so far that the output transistor supplies the ultimate unambiguous output signal, so that discharging which is effected more slowly because the additional transistors are turned on, no longer affects the output signal of the output transistor.

In a further embodiment the signal on the gates of the additional transistors is the voltage on the output of the logic circuit. In this case the additional transistors of the non-conductive series arrangements actually function as diodes throughout the voltage range, but now the output of the logic circuit is loaded by the gate capacitances of the additional transistors.

A third possibility is that the signal on the gates of the additional transistors is a clock signal, whose voltage value when the MOS sensing transistors conduct is smaller than the sum of the lowest voltage for which the output MOS transistor (T5) connected to the output of the logic circuit still supplies an unambiguous low signal, and the threshold voltage of the additional transistors, and whose voltage value is greater at least when the MOS charging transistor conducts. During the charging phase the series arrangements are then charged to a higher voltage value, so that during the consecutive sensing phase, when not one of the series circuit becomes conductive, the high level on the output of the logic circuit becomes more reliable. Therefore, it is effective for this third possibility if the voltage value of the clock signal when the MOS charging transistor conducts is equal to the operating voltage. Such a voltage value is easy to generate and ensures satisfactory charging of all the series arrangements, at least of those upper points which are connected to the additional transistors.

Figure 2:
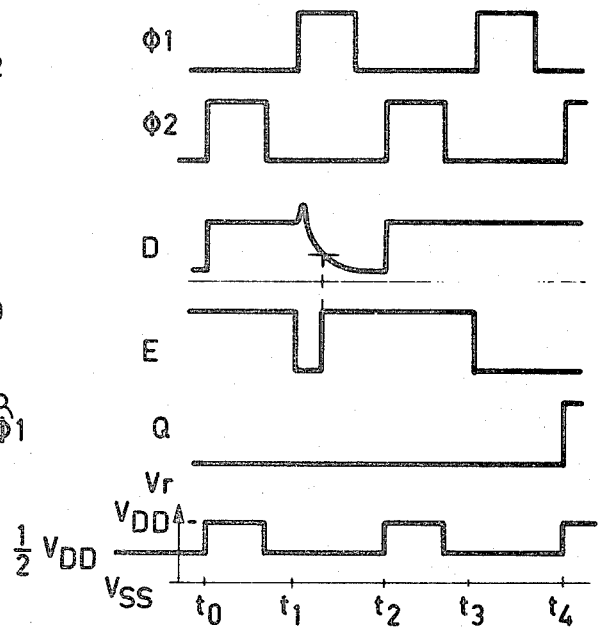

Embodiments of the invention will now be described in more detail, by way of example, with reference to the drawing. In the drawing:

FIG. 1 is a circuit diagram of a logic circuit in accordance with the invention followed by a flip-flop, FIG. 2 shows some diagrams representing the signal voltages as a function of time.

The circuit shown in FIG. 1 solely comprises MOS transistors, hereinafter referred to as transistors. The circuit comprises three sticks A, B and C, which each comprise a series arrangement of a plurality of transistors. In the present example only three sticks are shown, although in practice a substantially higher number of sticks with a higher number of transistors is used in order to exercise a correspondingly larger number of logic functions.

The upper ends of the sticks A, B and C are connected to each other and to a circuit point D, which represents the output of the logic circuit and which via a charging transistor T1, controlled by the clock signal $\phi 2$, is connected to the operating voltage $V_{DD}$. The gate of an output transistor T5 is connected to the output D via a transfer transistor T3 which is controlled by the clock signal $\phi 1$. The drain of the output transistor T5 is connected to the operating voltage $V_{DD}$ via a transistor T4 arranged as a load resistor and to the gate of a second output transistor T8 via a further transfer transistor T6 which is controlled by the clock signal $\phi 2$, the drain of the second output transistor $T_8$ being connected, via a transistor T7 arranged as a load resistor, to the operating voltage $V_{DD}$, to the output Q and to the gate of a third output transistor T10, whose drain is connected to the operating voltage $V_{DD}$ and to the further output QN via the transistor T9 which functions as a load resistor.

The transistors T4, T7 and T9 are depletion-type field-effect transistors, which are conductive and in this case function as current generators if their gates are connected to one of the main electrodes, which is indicated in that the line representing the main current path and situated opposite the gate is continuous, while inter alia the transistors T5, T6, T8 and T10 are enhancement-type field-effect transistors, for which the line representing the main current path is interrupted, because such transistors are turned on only if the potential on the gate is an amount equal to the threshold voltage $V_{TH}$ more positive than the potential on one of the main electrodes. For both types of transistors the main electrodes are interchangeable, that is, a current can flow through the transistor in either direction, which is of importance for reasons to be explained hereinafter.

In the circuit arrangement shown the transistor pairs T4 and T5, T7 and T8, as well as T9 and T10 each represent an inverter, which transfers the reference potential, which corresponds to the negative pole $V_{SS}$ of the operating voltage and to which the enhancement transistor of each inverter is connected, to the output if the voltage on the gate of the enhancement transistor is higher than the switching voltage $V_T$ of the enhancement transistor and which transfers the positive operating voltage $V_{DD}$ to the output when the voltage on the gate is lower. The switching voltage is higher than the threshold voltage $V_{TH}$ of the enhancement transistor which is connected to the reference voltage $V_{SS}$, because the transistor should be driven further into conduction until it can completely take over the current of the depletion-type transistor which is connected to the positive operating voltage. As a result of this, the switching voltage of each inverter can be adjusted within a specific range by suitably dimensioning the geometry of its two transistors. The last two inverters with the transistors T6 to T10 constitute a D-flipflop, which takes over the signal on the circuit point E upon the clock pulse $\phi 2$, transfers it to the mutually complementary outputs Q and QN, and also maintains the signal after the clock pulse $\phi 2$, because the signal on the gate of the transistor T8 remains stored in the gate capacitance when transfer transistor T6 is cut off. This further processing of the output signal of the output transistor T5 via a D-flipflop is only one possibility and is only mentioned here by way of example.

The stick A comprises a series arrangement of a plurality of enhancement-type field-effect transistors. The main electrode of the lower transistor TAO, which constitutes the sensing transistor, is connected to the reference potential $V_{SS}$ and the gate of this transistor receives the clock signal $\phi 1$. It is to be noted that the sensing transistors TAO may alternatively be arranged at a different location in the series arrangement. In the arrangement shown here the other main electrode is connected to the series arrangement of three further transistors TA1 to TA3, whose gates receive the signals to be processed via the input terminals A1 to A3. The series arrangement ends with the transistor TA, which receives the signal $V_G$ at its gate and which is connected to the circuit point D together with the corresponding transistors of the other sticks. When positive signal values appear on all inputs A1 to A3 and on connection $V_G$ all transistors of the series arrangement are conductive when the clock phase $\phi 1$ is positive, so that then a conductive connection is obtained between the circuit point D and the point of reference potential $V_{SS}$, as a result of which the circuit point D is pulled down to this potential. The stick A thus performs an NAND-function for the signals on the inputs A1 to A3, relative to the output D of the logic circuit.

In stick B the transistors TB2 and TB3 are depletion-type field-effect transistors which are always conductive, that is also when a low signal appears on input B2 or B3 respectively. The series arrangement of the stick B is consequently fully conductive if for corresponding high signals on the inputs VG and $\phi 1$ only the input B1 receives a high signal. The reason for this step is that in practice a substantially greater number of individual sticks with a substantially greater number of transistors are used in order to decode the various combinations of identical input signals, so that the entire circuit arrangement is constructed as a matrix of series arrangements of transistors and input lines intersecting the arrangements. The input line, which in a special stick should also perform the AND function for a low signal, then leads to a depletion-type transistor. In stick C, for example, this is only the case for transistor TC2. Each stick consequently represents and NAND-function for a different combination of input signals, which are NOR-ed via the common connection to the circuit point D.

The operation of this circuit, that is the variation of the individual signals as a function of time, will now be explained with reference to FIG. 2. This Figure represents the clock signals $\phi 1$ and $\phi 2$ as a function of time, which signals become alternatively positive and should not overlap but should exhibit a small interval between the alternate clock signals in which both clock signals are low.

At the instant $t_0$ the charge clock signals $\phi 2$ goes positive, so that the circuit point D also becomes positive, because the clock signal $\phi 1$ is at the same time low and turns off all series arrangements via the transistors TA0, TB0, TC0 etc. The voltage on the circuit point D then assumes a value which is an amount equal to the threahold voltage $V_{TH}$ of the transistor T1 lower than the high value of the clock signal $\phi 2$, which is assumed to be equal to the positive operating voltage $V_{DD}$. This voltage also persists after the end of the clock signal $\phi 2$, because the circuit point D has a capacitance relative to the other circuit sections with constant voltage, which maintains the charge for a specific time.

At the instant $t_1$ the clock signal $\phi_1$ becomes high, so that transistor T3 is turned on and transfers a part of the charge from circuit point D to the gate capacitance of transistor T5. In order to preclude an excessive voltage drop of the circuit point D the transistor T2, which is arranged as a capacitance, transfers a corresponding or slightly higher charge to the circuit point D upon the clock signal $\phi_1$. Since the gate of transistor T5 then becomes positive, the circuit point E will be at the voltage $V_{SS}$. At this instant transistor T6 is cut off because the clock signal $\phi_2$ is low.

When the clock signal $\phi_1$ starts at the instant $t_1$ transistors TA0, TB0 and TC0 are also turned on. For a further explanation the transistors TA, TB and TC are not considered for the time being or replaced by a constantly conducting connection. During the previous clock phase $\phi_2$ the signals on the inputs A1 to A3, B1 to B3 and C1 to C3 have been applied and it is assumed that the signals are such that transistors TA1 to TA3 and TC3 are turned on and transistors TB1 and TC1 are turned off. Transistors TB2, TB3 and TC2 conduct anyway because they are depletion-type transistors. As a result of this the series arrangement of the stick A, including the connection of the transistors TA0 and TA1, is charged to the potential of the circuit point D, which is also the case with the series arrangement of the stick B up to the connection between the transistors TB1 and TB2 and the series arrangement of stick C up to the connection of the transistors TC1 and TC2. If at the beginning of the clock signal $\phi_1$ transistors TA0 to TC0 are turned on, the series arrangement of stick A forms a conductive connection between the circuit point D and the reference potential $V_{SS}$, so that via the connection the circuit point D is discharged. However, if transistors TA to TC are assumed to be replaced by a conductive connection, the sticks B and C up to the cut-off transistors TB1 and TC1 must also be discharged. The sticks or the turned-on transistors therein represent a substantial capacitance. As the series arrangement of the transistors in the sticks cannot have been given an arbitrarily low impedance, the voltage of circuit point D and hence the voltage on the gate of transistor T5 decreases only comparatively slowly. The clock signal $\phi_1$ should now remain high until the circuit point D has discharged below the switching voltage of the inverter T4, so that the circuit point E can finally adopt an unambiguous high potential, which upon the next clock signal $\phi_2$ can be transferred to the transistor T8, that is to the D-flipflop via transistor T6. Since the clock signal $\phi_2$ should not become positive again until the clock signal $\phi_1$ has ended this considerably limits the maximum sequence of different input signals to be processed or the maximum switching frequency. In conformity with this delay during discharging, a delay or extension of the discharge time also occurs in the next clock phase $\phi_2$, if all sticks have been discharged and have to be charged again simultaneously and in parallel via the charging transistor $T_1$.

This discharge delay is avoided by the use of the transistors TA, TB and TC. On their gates the transistors receive a common signal $V_G$, for which various possibilities exist. This will be illustrated by means of some numerical examples, for which the following assumptions are made:

operating voltage $V_{DD}=5V$; $V_{SS}=0V$, threshold voltage of transistors T1, TA, TB and TC $V_{TH}=1V$.

In the first case it is assumed that the signal $V_G$ is a direct voltage of 2.5 V. If the clock signal $\phi_2$ goes to 5V, the circuit point D is charged to a voltage $5V-V_{TH}=4V$. The individual sticks A, B and C are only charged to a voltage $V_G-V_{TH}=1.5V$, because then the transistors TA, TB and TC are turned off. If now, as assumed in the previous example, the transistors TA to TA3 of the stick A are turned on by suitable input signals, stick A will be connected to the reference voltage $V_{SS}$ via transistor TA0 at the beginning of the clock signal $\phi_1$, so that transistor TA is turned on and circuit point D is discharged. However, transistors TB and TC remain in the almost conductive state, so that no current can flow from the capacitances represented by the transistors of the sticks B and C to the circuit point D and consequently via stick A to $V_{SS}$.

Thus, circuit point D is discharged relatively fast, until a voltage of 1.5 V is reached. It is not until this instant that the transistors TB and TC are turned on, because then the upper main electrodes of the transistors are more negative by an amount corresponding to the threshold value $V_{TH}=1V$ than the voltage $V_G=2.5$ V on the gates of these transistors. It is not until this instant that a current flows from the capacitances constituted by the transistors of the sticks B and C into the stick A and thereby slows down the discharge of the circuit point D. When the inverter T4/T5 is so dimensioned that it produces a high potential on circuit point E at an input voltage of 1.5V, the delay in the discharge process, which begins at a voltage of 1.5 V on the circuit point D, no longer affects the signal which ultimately appears on the circuit point E, so that the clock signal $\phi_1$ can already return to 0V before circuit point D has been discharged completely, because then a voltage remains stored in the gate of transistor T5 which gives rise to a high potential on point E. In FIG. 2 this is represented by the curve D, where the switching voltage of the inverter T4/T5 is represented by a horizontal line through the discharge curve, the curve E being high again after this point of intersection. Upon the next clock signal $\phi_2$ at the instant $t_2$ this high voltage on the circuit point E is transferred to the flip-flop via the transfer transistor T6, which was already in this state, as is represented by the curve of the output signal of the flipflop on the Q-output.

During the clock signal $\phi_2$, which starts at the instant $t_2$, the inputs A1 to A3 etc. of the sticks A, B and C receive other signals which may form such a combination that none of the sticks is turned on upon the next clock signal $\phi_1$ which starts at the instant $t_3$ and the circuit point D is consequently not discharged. As a result of this the circuit point E will be at the reference potential $V_{SS}$ at the instant $t_3$ and upon the next clock signal $\phi_2$ at the instant $t_4$ the potential is transferred to the flip-flop via the transfer transistor T6, so that the Q output adopts a high potential.

By the use of the transistors TA, TB and TC and the application of a fixed voltage to their gates a higher switching speed and thus a higher repetition frequency of the clock signals $\phi_1$ and $\phi_2$ can be obtained, because a conductive stick only discharges the circuit point D and does not discharge the other cut-off sticks until the inverter T4/T5 has reached its final switching state.

A second possibility for the voltage $V_G$ on the gates of the transistors TA, TB and TC is to connect these to the circuit point D, as is represented by the broken line in FIG. 1. During the clock signal φ2 the sticks are then charged to a voltage which is an amount corresponding to the threshold voltage of the transistors TA, TB and TC lower than the voltage on the circuit point D. If the circuit point D is then discharged by a conductive stick, for example the stick A, only transistor TA is turned on, while the transistors TB and TC remain cut-off until a maximum degree of discharging is obtained for which the voltage on circuit point D exceeds the voltage $V_{SS}$ by an amount equal to the threshold voltage of transistor TA. The transistors TB and TC of the cut-off sticks consequently behave as diodes, which only permit charging or replenishing a charge drained from circuit point D via the transistor T1, but which do not allow discharging of the cut-off sticks via the circuit point D.

As the gates of trnsistors TA, TB and TC are connected to the circuit point D the capacitive load at the last-mentioned point will slightly increase, so that the charging process is slightly delayed, but to a substantially smaller extent than in the absence of the transistors TA, TB and TC.

In accordance with a third possibility all the capacitances in the sticks below the additional transistors are not charged to the full value $V_G-V_{TH}$ at high clock frequencies, i.e. a short charging phase (φ2=high) but only the capacitances adjacent the additional transistors are fully charged, because it takes some time until the charges have reached the drain of the first cut-off transistor. If, for example, in stick B transistor TB1 cuts off, its drain has not been charged to $V_G-V_{TH}$ at the end of a short charging phase φ2, but only the drain of the transistor TB3. Upon termination of the charging phase a uniform charge distribution is obtained in stick B, that is all capacitances in the stick between the source of the additional transistor TB and the drain of the transistor TB1 assume substantially the same voltage. However, for this purpose charge should be drained from the drain connection of the transistor TB3, that is its voltage drops below $V_G-V_{TH}$, so that transistor TB3 can be turned on and drains charge from the circuit point D. If this occurs in many parallel sticks, it may happen that so much charge is drained from circuit point D that the switching threshold of the following inverter T4/T5 is exceeded, so that the inverter supplies a high signal to circuit point E although the charges on circuit point D have not been drained to the reference potential $V_{SS}$ via a conductive stick, but only a charge equalisation occurs inside the stick.

A step to eliminate this effect, which effect may occur at very high clock frequencies, by suitable means is not to maintain the voltage $V_G$ constant but to increase it during the clock signal φ2. This is represented in the lower part of FIG. 2, where the voltage $V_G$ is raised to the positive operating voltage $V_{DD}$ during the clock signal φ2, while for the rest of the time it is equal to half the operating voltage. This is achieved in that during the clock phase φ2 at least the ends of all sticks which are coupled to the circuit point D are charged to substantially the voltage on circuit point D, that is to 4 V in the numerical example given hereinbefore. If during the next clock signal φ1 no stick conducts, all transistors TA, TB and TC are cut off, because in the sense phase their gate voltage $V_G$ is only 2.5 V. The charges stored at that end of the stick which is coupled to the circuit point D are distributed uniformly over the entire stick up to the first cut-off transistor. Stick B will not drain charge from circuit point D until the source voltage of transistor TB3 has dropped to $V_G-V_{th}=2.5$ V$-1$V$\doteq 1.5$ V (as a result of the charge equalisation in the stick.) Thus clock $V_G$ increases the reliability and thereby permits higher clock frequencies.

For all the possibilities it is therefore essential that the transistors TA, TB and TC receive such a signal $V_G$ on their gates that these transistors are cut off when the sticks do not conduct until the output signal has reached its final value.

What is claimed is:

1. A logic circuit in two phase MOS technology comprising a plurality of logic elements, each of said plurality arranged to include a MOS sensing transistor and a series arrangement of MOS transistors,
   first means for applying signals to be processed to said series arrangements,
   second means for applying sensing clock signals to said sensing transistors,
   third means for applying a reference potential to one end of each of said series arrangements,
   fourth means for applying operating voltage to the opposite end of each of said series arrangement through a MOS charging transistor common to each of said series arrangements, said charging transistor receiving charging clock signals, said sensing transistor of each of said series arrangements and said charging transistor being alternatively conductive in time, said charging transistor having a main electrode connected to said series arrangements,
   fifth means for applying outputs of said series arrangements to a gate of at least one MOS output transistor, said MOS output transistor supplying unambiguous low signals when the output of said logic circuit carries a voltage between said operating voltage and a fraction thereof, and
   additional MOS transistors connected between each of said series arrangements and said MOS charging transistor, said additional MOS transistors having gate electrodes together receiving a signal such that each of said additional MOS transistors is cut-off for voltage values between said operating voltage and a voltage value lower than a fraction of voltage on said output at least during conductive phases of said sensing transistors.

2. A logic circuit according to claim 1, wherein said additional MOS transistors control capacitive discharge of said series arrangements of MOS transistors by said signal.

3. A logic circuit according to claim 1, wherein said additional MOS transistors are enhancement type transistors.

4. A logic circuit according to claim 3, wherein said signal on said gate electrodes of said additional MOS transistors is a direct voltage having a value smaller than the sum of the lowest voltage on said MOS output transistors and the threshold voltage of said additional MOS transistors, said lowest voltage being a value for maintaining said unambiguous low signals.

5. A logic circuit according to claim 3, wherein said signal on said gate electrodes of said additional MOS transistors is equivalent to said operating voltage.

6. A logic circuit according to claim 3, wherein said signal on said gate electrodes of said additional MOS transistors is a clock signal having voltage values, when said sensing transistors conduct, smaller than the sum of the lowest voltage for which said output transistor supplies an unambiguous low signal and a threshhold voltage of said additional MOS transistors, said voltage values of said clock signal being greater at least when said MOS charging transistor conducts.

7. A logic circuit according to claim 6, wherein said voltage values of said clock signal is equal to said operating voltage when said MOS charging transistor conducts.

* * * * *